US012635166B2

(12) United States Patent　　　　　(10) Patent No.:　US 12,635,166 B2
Yoon　　　　　　　　　　　　　　　　(45) Date of Patent:　May 19, 2026

(54) GaN POWER DEVICE

(71) Applicant: LX Semicon Co., Ltd., Daejeon (KR)

(72) Inventor: Jang Hyun Yoon, Daejeon (KR)

(73) Assignee: LX Semicon Co., Ltd., Daejeon (KR)

( * ) Notice: Subject to any disclaimer, the term of this patent is extended or adjusted under 35 U.S.C. 154(b) by 701 days.

(21) Appl. No.: 17/939,781

(22) Filed: Sep. 7, 2022

(65) Prior Publication Data

US 2023/0115017 A1　　Apr. 13, 2023

(30) Foreign Application Priority Data

Oct. 5, 2021　　(KR) ........................ 10-2021-0131657

(51) Int. Cl.
| *H10D 30/47* | (2025.01) |
| *H10D 62/85* | (2025.01) |
| *H10D 64/27* | (2025.01) |
| *H10P 14/69* | (2026.01) |
| *H10P 50/00* | (2026.01) |

(52) U.S. Cl.
CPC ......... *H10D 30/47* (2025.01); *H10D 62/8503* (2025.01); *H10D 64/513* (2025.01); *H10P 14/6903* (2026.01); *H10P 50/00* (2026.01)

(58) Field of Classification Search
None
See application file for complete search history.

(56) References Cited

U.S. PATENT DOCUMENTS

| 9,685,549 | B2 | 6/2017 | Okita et al. |
| 2013/0307026 | A1 | 11/2013 | Hwang et al. |
| 2019/0288101 | A1 | 9/2019 | Longobardi et al. |

FOREIGN PATENT DOCUMENTS

| CN | 110392929 A | * 10/2019 | ........ H01L 29/0619 |
| JP | 6132242 | 4/2017 | |
| KR | 2011-0026812 A | 3/2011 | |
| KR | 10-1113305 B1 | 3/2012 | |
| KR | 10-2013-0128281 A | 11/2013 | |
| KR | 10-1897227 B1 | 9/2018 | |
| KR | 2019-0015095 A | 2/2019 | |

* cited by examiner

*Primary Examiner* — Jack S Chen
(74) *Attorney, Agent, or Firm* — POLSINELLI PC

(57) ABSTRACT

The present disclosure discloses a GaN power device having a structure improved to have an improved current density. The GaN power device includes a GaN layer, a first electrode and a second electrode formed on the GaN layer in a way to have a separation area therebetween, an AlGaN layer formed on the GaN layer of the separation area, a gate electrode formed over the AlGaN layer in a way to be separated from the first electrode and the second electrode, and a 2DEG layer formed at an interface of the AlGaN layer and the GaN layer in an area between the gate electrode and the second electrode.

8 Claims, 6 Drawing Sheets

GaN POWER DEVICE

BACKGROUND

1. Technical Field

The present disclosure relates to a gallium nitride (here-inafter referred to as a "GaN") power device, and more particularly, to a GaN power device having a structure improved to have an improved current density.

2. Related Art

Recently, the development of a GaN power device is actively in progress.

The GaN power device may be structured such that a GaN layer and an AlGaN layer are sequentially stacked over a substrate and the AlGaN layer is used as an electron travel layer.

The GaN power device may include a two-dimensional electron gas (hereinafter referred to as a "2DEG") layer formed at the bonding interface of the GaN layer and the AlGaN layer.

The GaN power device having the structure may be used in the construction of a high-efficiency switching device or the construction of a high withstand voltage power device due to characteristics of GaN having high breakdown field strength and a high saturation electron speed.

The GaN power device needs to be designed to have a high current density in accordance with high power.

A GaN power device having a limited chip size has a difficulty in increasing the current density of the GaN power device.

Furthermore, if the channel size of the GaN power device is increased to have a high current density, the GaN power device has a problem in that the chip size of the GaN power device is increased.

SUMMARY

Various embodiments are directed to providing a GaN power device having a high current density in a limited chip size.

Also, various embodiments are directed to providing a GaN power device having a high current density without increasing a chip size.

In an embodiment, a GaN power device may include a GaN layer, a first electrode and a second electrode formed on the GaN layer in a way to have a separation area therebe-tween, an AlGaN layer formed on the GaN layer of the separation area, a gate electrode formed over the AlGaN layer in a way to be separated from the first electrode and the second electrode, and a 2DEG layer formed at an interface of the AlGaN layer and the GaN layer in an area between the gate electrode and the second electrode. At least one concave surface may be formed in the GaN layer under the 2DEG layer, and the interface and the 2DEG layer may be formed along the concave surface.

In another embodiment, a GaN power device may include a GaN layer, a first electrode and a second electrode formed on the GaN layer in a way to have a separation area therebetween, an AlGaN layer formed on the GaN layer of the separation area, a gate electrode formed over the AlGaN layer in a way to be separated from the first electrode and the second electrode, and a 2DEG layer formed at an interface of the AlGaN layer and the GaN layer in an area between the gate electrode and the second electrode. At least one convex surface may be formed in the GaN layer under the 2DEG layer, and the interface and the 2DEG layer may be formed along the convex surface.

The GaN power device of the present disclosure can increase an area in which the 2DEG layer is formed by changing an interface structure of the GaN layer and the AlGaN layer.

Accordingly, the GaN power device of the present disclosure has an advantage in that the GaN power device can be designed to have a high current density even in a limited chip size.

Furthermore, the GaN power device of the present disclosure has an advantage in that the GaN power device can be designed to have a high current density without increasing a chip size.

DETAILED DESCRIPTION

A GaN power device of the present disclosure is embod-ied using characteristics of GaN.

GaN may have a higher bandgap than silicon, and may have high breakdown field strength and a high saturation electron speed that much.

The GaN power device may have a 2DEG layer having a high concentration. The GaN power device using the 2DEG layer maintains normally turn-on.

A GaN power device according to a preferred embodi-ment of the present disclosure may be described with reference to FIG. 1.

Figure 1:
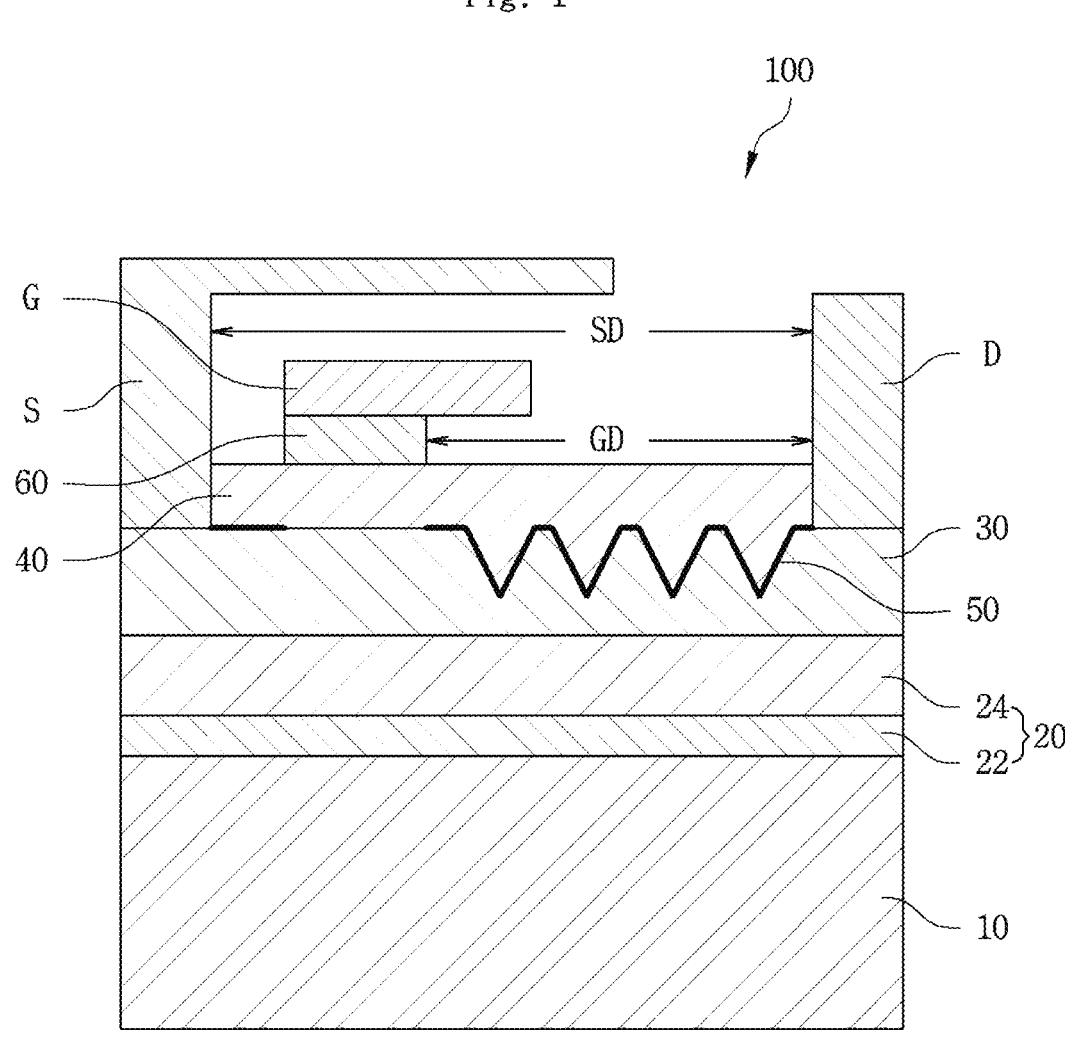
FIG. 1 is a cross-sectional view of a GaN power device according to a preferred embodiment of the present disclosure.

The GaN power device of FIG. 1 is illustrated as having a transistor structure, and includes a gate, a drain and a source as terminals of the GaN power device. Due to the construction, the GaN power device of FIG. 1 may maintain normally turn-on by a 2DEG layer. It may be understood that the turn-on state of the GaN power device is controlled by a voltage of the gate.

A GaN power device 100 may be formed on a silicon substrate 10.

A buffer layer 20 may be constructed on the silicon substrate 10. The buffer layer 20 may include an AlN nucleation layer 22 and an AlGaN/GaN buffer layer 24 sequentially formed over the silicon substrate 10. The AlN means aluminum nitride. Furthermore, the AlGaN/GaN buffer layer 24 means a buffer layer formed using an AlGaN material or a GaN material. Furthermore, the AlGaN means aluminum gallium nitride.

The buffer layer 20 is constructed in order to grow a GaN layer 30 over the silicon substrate 10.

If a nitride-series thin film, such as the GaN layer 30, is grown over the silicon substrate 10, a dislocation density may be increased due to a lattice constant mismatch between the silicon substrate 10 and a nitride thin film, and a crack may occur due to tensile stress occurring due to a difference in a coefficient of thermal expansion. The nitride thin film requires the buffer layer 20 in order to have a high crystallizability and be grown over the silicon substrate 10 without a crack.

The buffer layer 20 including the AlN nucleation layer 22 and the AlGaN/GaN buffer layer 24 is merely an example, and may be variously implemented depending on a manufacturer's intention.

Furthermore, the GaN layer 30 may be formed on the buffer layer 20.

The GaN layer 30 may be understood as a layer on which intended doping with impurities is not performed. Accordingly, the GaN layer 30 may be understood as an N type semiconductor. Furthermore, the GaN layer 30 may be understood as an electron travel layer.

A first electrode, a second electrode and an AlGaN layer 40 may be formed on the GaN layer 30. In this case, the first electrode may be illustrated as a source electrode S, and the second electrode may be illustrated as a drain electrode D.

The source electrode S and the drain electrode D may be formed to have a separation area SD therebetween. Furthermore, the AlGaN layer 40 may be formed on the GaN layer 30 of the separation area SD.

The AlGaN layer 40 may be understood as an electron supply layer.

A gate electrode G may be formed over the AlGaN layer 40. The gate electrode G is preferably constructed to be separated from the source electrode S and the drain electrode D.

The gate electrode G, the source electrode S and the drain electrode D may be formed by the deposition of gold (Au), aluminum (Al) or platinum (Pt), for example.

A cap layer 60 may be formed between the gate electrode G and the AlGaN layer 40. The cap layer 60 may be constructed as a P type semiconductor doped with P type impurities (e.g., magnesium (Mg)) at a preset concentration. That is, the cap layer 60 may be formed using P type GaN.

Due to the construction, a channel between the gate electrode G and the drain electrode D is formed between the cap layer 60 and the drain electrode D. Accordingly, an area between the gate electrode G and the drain electrode D may be understood as an area indicated by GD in FIG. 1.

A 2DEG layer 50 is formed at the interface of the GaN layer 30 and the AlGaN layer 40. The 2DEG layer 50 may be formed in an area that belongs to the interface of the GaN layer 30 and the AlGaN layer 40 and that is disposed area between the source electrode S and the gate electrode G and in the area GD between the gate electrode G and the drain electrode D. The 2DEG layer 50 is not formed in an area under the gate electrode G.

The 2DEG layer 50 may be understood as a layer in which a 2DEG has been generated. The 2DEG layer 50 has a two-dimensional shape at the interface of the GaN layer 30 and the AlGaN layer 40, and thus can guarantee a free movement of electrons.

In the aforementioned construction, the buffer layer 20, the GaN layer 30, the AlGaN layer 40 and the cap layer 60 may be formed by epitaxy, for example. In order to form each layer, a different source and mixed gas may be used for each layer.

Furthermore, an insulating film may be formed in the area GD between the gate electrode G and the drain electrode D and the separation area SD between the source electrode S and the drain electrode D. In order to form the insulating film, a nitride film may be deposited. The nitride film may be deposited by atomic layer deposition (ALD) or chemical vapor deposition (CVD), for example.

An embodiment of the present disclosure has a construction for implementing a high current density.

To this end, one or more concave surfaces may be formed in the GaN layer 30 under the 2DEG layer 50 corresponding to the area GD between the gate electrode G and the drain electrode D. Furthermore, the interface of the GaN layer 30 and the AlGaN layer 40 and the 2DEG layer 50 may be formed along the concave surfaces.

The concave surface may be constructed by forming a trench on a corresponding surface of the GaN layer 30. Furthermore, the trench may be formed by a method, such as dry etch.

In this case, the trench may be formed to have an inverted triangular cross section as in FIG. 1. The concave surface of the GaN layer 30 may be formed to have an inverted triangular cross section by the shape of the trench.

The embodiment of FIG. 1 illustrates that a plurality of concave surfaces has been formed in the GaN layer 30 under the 2DEG layer 50 corresponding to the area GD between the gate electrode G and the drain electrode D. The concave surfaces may be formed in divided areas, respectively, and may be disposed to be separated from each other.

According to the present disclosure, if the concave surfaces are formed in the GaN layer 30, in general, a wider area for forming the 2DEG layer 50 can be provided compared to a case where the GaN layer 30 is flat.

In an embodiment of the present disclosure, as described above, the interface of the GaN layer 30 and the AlGaN layer 40 may be expanded by the concave surfaces. As a result, the 2DEG layer 50 in the area GD between the gate electrode G and the drain electrode D may have a wider area.

Accordingly, a current density between the gate electrode G and the drain electrode D may be increased in proportion to an increase in the area of the 2DEG layer 50 in the area GD between the gate electrode G and the drain electrode D.

Accordingly, the embodiment of the present disclosure illustrated in FIG. 1 can increase the area, in which the 2DEG layer is formed, by forming the concave surfaces at the interface of the GaN layer and the AlGaN layer.

Accordingly, the GaN power device 100 can be designed to have a high current density even in a limited chip size, and can be designed to have a high current density without increasing a chip size.

Figure 2:
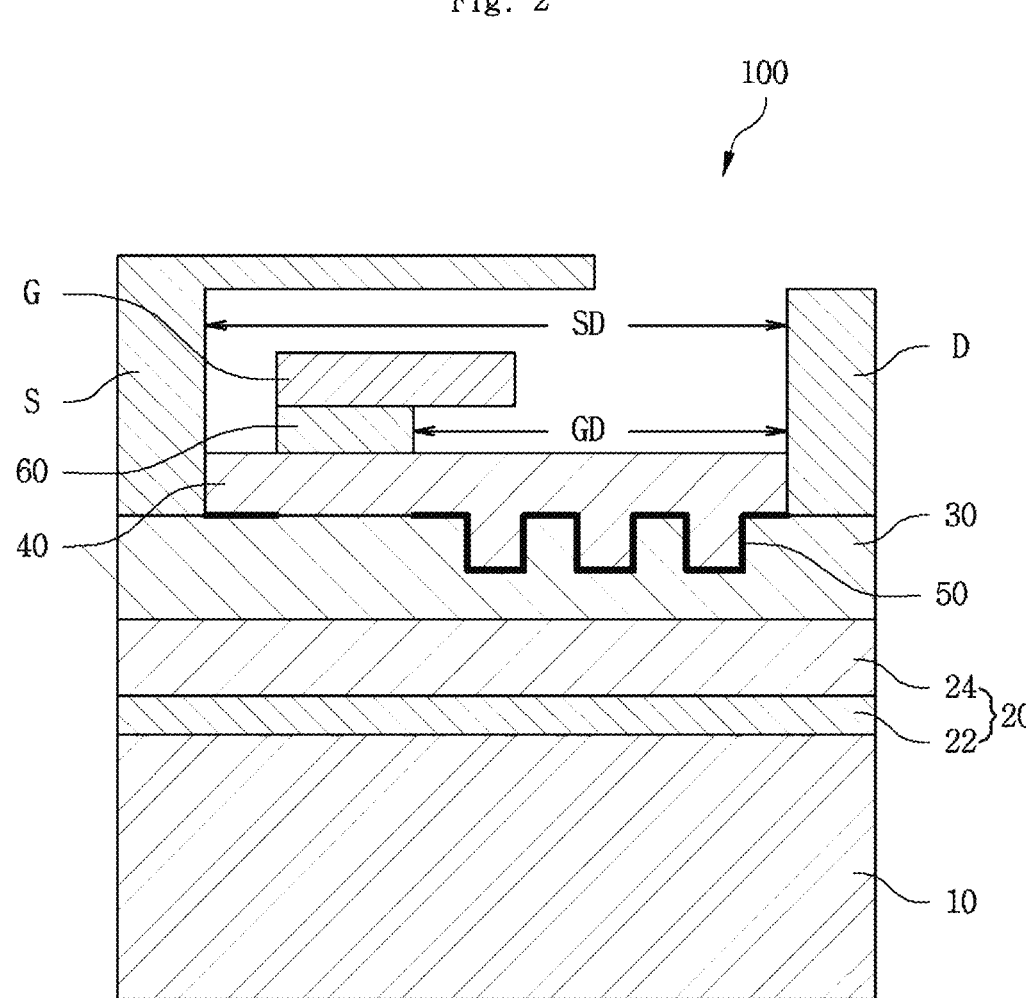
FIG. 2 is a cross-sectional view of a GaN power device according to another embodiment of the present disclosure.

Concave surfaces of the present disclosure may be implemented as in FIG. 2. In FIG. 2, the same element as that of FIG. 1 is indicated by the same reference numeral, and a redundant description thereof is omitted.

As in FIG. 2, a plurality of trenches each having a rectangular cross section may be formed in a GaN layer 30 under a 2DEG layer 50 corresponding to an area GD between a gate electrode G and a drain electrode D.

Concave surfaces formed by the respective trenches in FIG. 2 having the rectangular cross sections may be formed in divided areas, respectively, and may be disposed to be separated from each other.

Even in the embodiment of FIG. 2, the interface of the GaN layer 30 and an AlGaN layer 40 and the 2DEG layer 50 may be formed along the concave surfaces having the rectangular cross sections, that is, the trenches.

In the present disclosure, the concave surfaces may be formed to have various cross section structures depending on a manufacturer's intention. A cross section structure of the concave surface implemented by the present disclosure is not limited by the embodiments of FIGS. 1 and 2.

Figure 3:
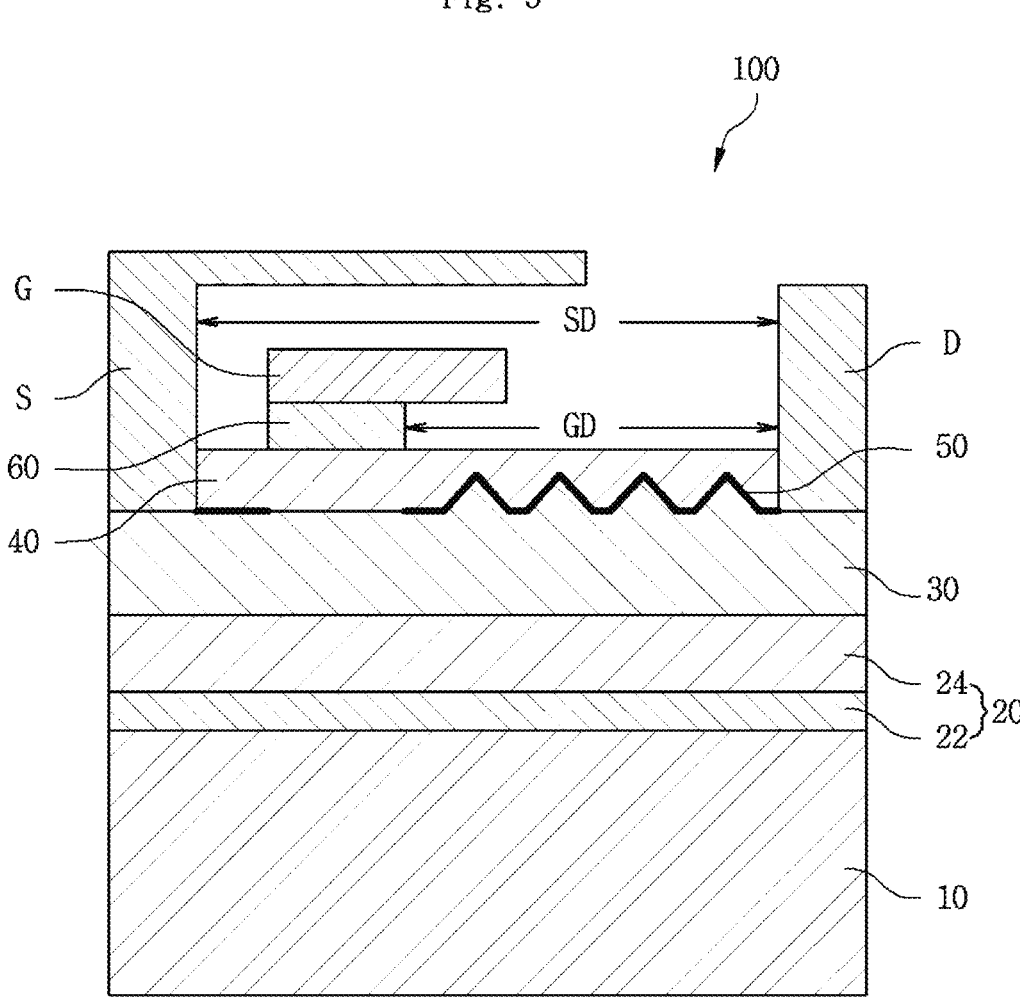
FIG. 3 is a cross-sectional view of a GaN power device according to still another embodiment of the present disclosure.

Furthermore, as another embodiment of the present disclosure, a cross section structure of the concave surface may be constructed as in FIG. 3.

The embodiment of FIG. 3 may be implemented so that one or more convex surfaces are formed in a GaN layer 30 under a 2DEG layer 50 corresponding to an area GD between a gate electrode G and a drain electrode D. Furthermore, the interface of the GaN layer 30 and an AlGaN layer 40 and the 2DEG layer 50 may be formed along the convex surfaces. In FIG. 3, the same element as that of FIG. 1 is indicated by the same reference numeral, and a redundant description thereof is omitted.

The convex surfaces may be constructed by forming stacked bodies on a corresponding surface of the GaN layer 30. Furthermore, the stacked bodies may be formed by selectively additionally stacking GaN at a corresponding location after the GaN layer 30 is formed.

In this case, the stacked bodies may be formed to have triangular cross sections, respectively, as in FIG. 3. The convex surfaces of the GaN layer 30 may be formed to have the triangular cross sections by shapes of the stacked bodies.

The embodiment of FIG. 3 illustrates that a plurality of convex surfaces has been formed in the GaN layer 30 under the 2DEG layer 50 corresponding to the area GD between the gate electrode G and the drain electrode D. The convex surfaces may be formed in divided areas, respectively, and may be disposed to be separated from each other.

According to the present disclosure, if the convex surfaces are formed in the GaN layer 30, in general, a wider area for forming the 2DEG layer 50 can be provided compared to a case where the GaN layer 30 is flat.

In an embodiment of the present disclosure, the interface of the GaN layer 30 and the AlGaN layer 40 may be expanded by the convex surfaces as described above. As a result, the 2DEG layer 50 in the area GD between the gate electrode G and the drain electrode D may have a wider area.

Accordingly, a current density between the gate electrode G and the drain electrode D may be increased in proportion to an increase in the area of the 2DEG layer 50 in the area GD between the gate electrode G and the drain electrode D.

Accordingly, the embodiment of the present disclosure of FIG. 3 can increase the area, in which the 2DEG layer is formed, by forming the convex surfaces in the interface of the GaN layer and the AlGaN layer.

Accordingly, the GaN power device 100 can be designed to have a high current density even in a limited chip size, and can be designed to have a high current density without increasing a chip size.

Figure 4:
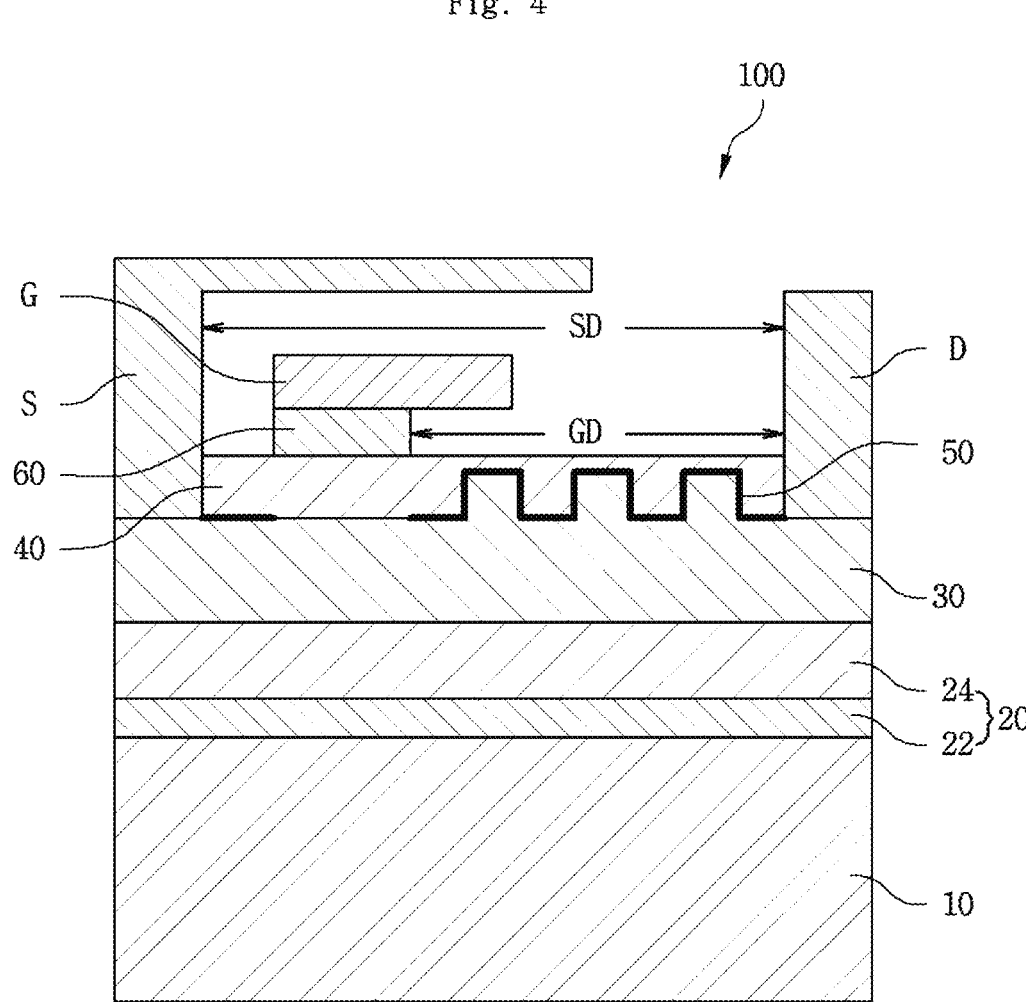
FIG. 4 is a cross-sectional view of a GaN power device according to yet another embodiment of the present disclosure.

Convex surfaces of the present disclosure may be implemented as in FIG. 4. In FIG. 4, the same element as that of FIG. 3 is indicated by the same reference numeral, and a redundant description thereof is omitted.

As in FIG. 4, a plurality of stacked bodies having rectangular cross sections, respectively, may be formed in a GaN layer 30 under a 2DEG layer 50 corresponding to an area GD between a gate electrode G and a drain electrode D.

Convex surfaces in of FIG. 4 formed by the stacked bodies having the rectangular cross sections may also be formed in divided areas, respectively, and may be disposed to be separated from each other.

Even in the embodiment of FIG. 4, the interface of the GaN layer 30 and an AlGaN layer 40 and the 2DEG layer 50 may be formed along the convex surfaces having the rectangular cross sections, that is, the stacked bodies.

In the present disclosure, the convex surfaces may be formed to have various cross section structures depending on a manufacturer's intention. A cross section structure of the convex surface implemented by the present disclosure is not limited by the embodiments of FIGS. 3 and 4.

Furthermore, the concave surfaces implemented as in FIGS. 1 and 2 of the present disclosure or the convex surfaces implemented as in FIGS. 3 and 4 of the present disclosure may be embodied to have various plane patterns.

Figure 5:
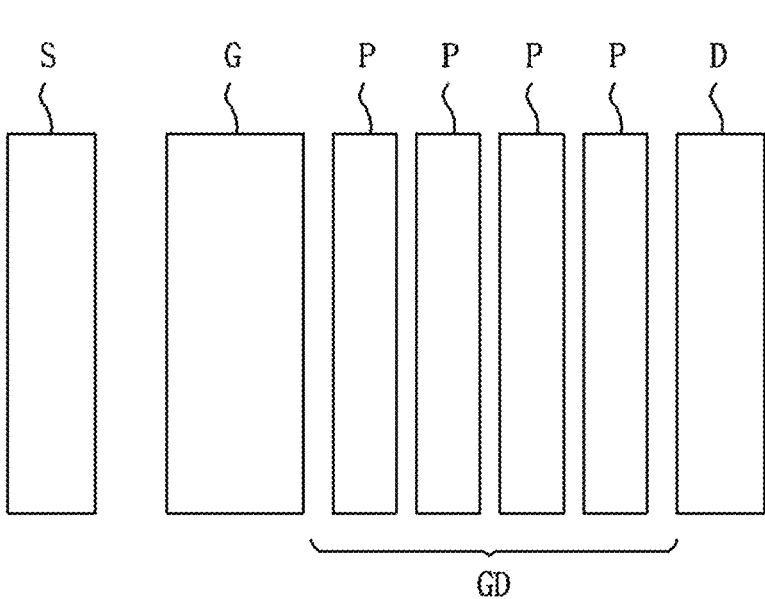
FIG. 5 is a plan view illustrating an example of a layout according to the embodiments of the present disclosure.

FIG. 5 illustrates plane patterns of the GaN power device 100 of the present Disclosure.

In FIG. 5, the source electrode S, the gate electrode G and the drain electrode D are illustrated as being separated from one another in parallel. Furthermore, a plurality of plane patterns P is disposed in the area GD between the gate electrode G and the drain electrode D.

The plane patterns P may be understood to correspond to the concave surfaces of FIGS. 1 and 2 or the convex surfaces of FIGS. 3 and 4, respectively.

In FIG. 5, the plane patterns P are illustrated as having bar patterns, respectively. Furthermore, the plane patterns P are disposed in parallel at given intervals. Furthermore, the plane patterns P are disposed to be parallel to the gate electrode G and the drain electrode G.

Figure 6:
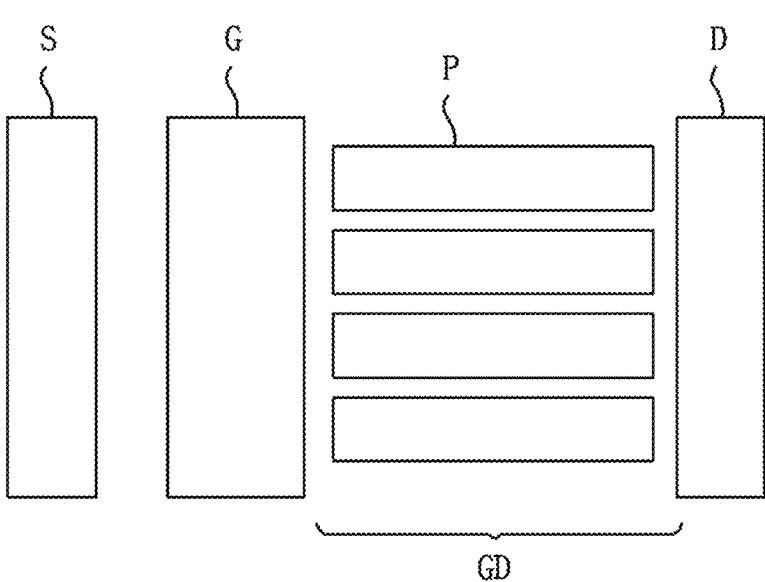
FIG. 6 is a plan view illustrating another example of the layout according to the embodiments of the present disclosure.

Plane patterns of the GaN power device 100 of the present disclosure may be illustrated as in FIG. 6. In FIG. 6, the source electrode S, the gate electrode G and the drain electrode D are illustrated as being separated from one another in parallel in the same manner as FIG. 5. Furthermore, the plurality of plane patterns P is disposed in the area GD between the gate electrode G and the drain electrode D.

The plane patterns P of FIG. 6 are illustrated as having bar patterns, respectively. Furthermore, the plane patterns P are disposed in parallel at given intervals.

However, unlike FIG. 5, the plane patterns P of FIG. 6 are disposed in a direction crossing the gate electrode G and the drain electrode G.

Figure 7:
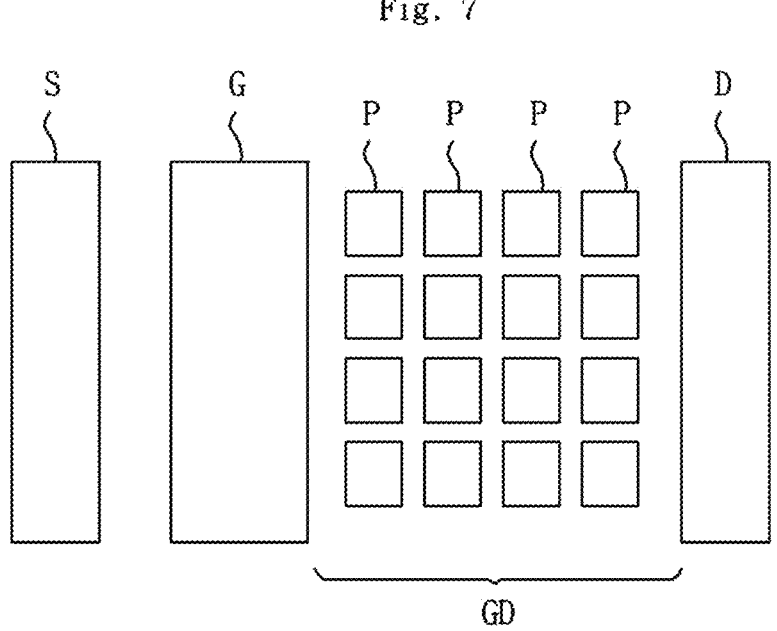
FIG. 7 is a plan view illustrating still another example of the layout according to the embodiments of the present disclosure.

Furthermore, the plane patterns of the GaN power device 100 of the present disclosure may be illustrated as in FIG. 7. In FIG. 7, the source electrode S, the gate electrode G and the drain electrode D are illustrated as being separated from one another in parallel in the same manner as FIG. 5. Furthermore, the plurality of plane patterns P is disposed in the area GD between the gate electrode G and the drain electrode D.

The plane patterns P of FIG. 7 are illustrated as having rectangular patterns, respectively. Furthermore, the plane patterns P are disposed to be separated from one another while forming a matrix structure.

In the present disclosure, the plane patterns of the concave surfaces or the convex surfaces may be variously formed and disposed depending on a manufacturer's intention. Shapes and arrangements of the plane patterns implemented by the present disclosure are not limited by the embodiments of FIGS. 5 to 7.

As in the aforementioned embodiments, the GaN power device of the present disclosure can increase the area, in which the 2DEG layer is formed, by changing the interface structure of the GaN layer and the AlGaN layer in a way to have the concave surfaces or the convex surfaces.

Accordingly, the GaN power device of the present disclosure can be designed to have a high current density even in a limited chip size.

Furthermore, the GaN power device of the present disclosure can be designed to have a high current density without increasing a chip size.

What is claimed is:

1. A gallium nitride (GaN) power device comprising:
a GaN layer of a n-type conductivity type;
a source electrode and a drain electrode on the GaN layer in a way to have a separation area therebetween;
an AlGaN layer on the GaN layer of the separation area;
a gate electrode separated from the source electrode and the drain electrode over the AlGaN layer;
a cap layer of a p-type conductivity type disposed between the AlGaN layer and the gate electrode; and
a 2DEG layer at an interface of the AlGaN layer and the GaN layer in an area between the cap layer and the drain electrode,
wherein at least one concave surface is in the GaN layer under the 2DEG layer,
the interface and the 2DEG layer are formed along the concave surface, and
wherein a first spaced distance between the cap layer and the drain electrode is greater than a second spaced distance between the gate electrode and the drain electrode.

2. The GaN power device of claim 1, wherein the concave surface comprises an inverted triangular trench.

3. The GaN power device of claim 1, wherein the concave surface is composed of a rectangular trench by etching.

4. The GaN power device of claim 1, wherein a plane pattern of the concave surface has a bar pattern parallel to the gate electrode and the drain electrode.

5. The GaN power device of claim 1, wherein a plane pattern of the concave surface has a bar pattern disposed in a direction crossing the gate electrode and the drain electrode.

6. The GaN power device of claim 1, wherein:
the concave surface is formed in the GaN layer under the 2DEG layer in plural number, and
the plurality of concave surfaces is disposed to be separated from one another in a plane between the gate electrode and the drain electrode.

7. The GaN power device of claim 6, wherein the plurality of concave surfaces is disposed to be separated from one another in a way to form a matrix structure on a plane between the gate electrode and the drain electrode.

8. The GaN power device of claim 1, wherein a portion of the 2DEG layer is vertically overlapped with the gate electrode, but is not overlapped with the cap layer.

* * * * *